(12) United States Patent
Choi et al.

(10) Patent No.: US 11,791,456 B2
(45) Date of Patent: Oct. 17, 2023

(54) NEGATIVE ELECTRODE WITH CARBON-BASED THIN FILM, MANUFACTURING METHOD THEREFOR, AND LITHIUM SECONDARY BATTERY COMPRISING SAME

(71) Applicant: LG CHEM, LTD., Seoul (KR)

(72) Inventors: Heewon Choi, Daejeon (KR); Eun Kyung Kim, Daejeon (KR); Ki Hwan Kim, Daejeon (KR); Sangwook Woo, Daejeon (KR); Jeong Woo Shon, Daejeon (KR); Ohbyong Chae, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 173 days.

(21) Appl. No.: 16/465,499

(22) PCT Filed: Mar. 8, 2018

(86) PCT No.: PCT/KR2018/002739
§ 371 (c)(1),
(2) Date: May 30, 2019

(87) PCT Pub. No.: WO2018/164494
PCT Pub. Date: Sep. 13, 2018

(65) Prior Publication Data
US 2020/0067075 A1 Feb. 27, 2020

(30) Foreign Application Priority Data
Mar. 10, 2017 (KR) .......... 10-2017-0030399
Mar. 7, 2018 (KR) .......... 10-2018-0026852

(51) Int. Cl.
*H01M 4/36* (2006.01)
*H01M 4/04* (2006.01)
(Continued)

(52) U.S. Cl.
CPC ......... *H01M 4/366* (2013.01); *H01M 4/0426* (2013.01); *H01M 4/0471* (2013.01);
(Continued)

(58) Field of Classification Search
None
See application file for complete search history.

(56) References Cited

U.S. PATENT DOCUMENTS 7,718,321 B2   5/2010   Yoon et al.
9,564,630 B2   2/2017   Wang et al.
(Continued)

FOREIGN PATENT DOCUMENTS

CN   100359721 C   1/2008
CN   104716382 A   6/2015
(Continued)

OTHER PUBLICATIONS

International Search Report for PCT/KR2018/002739 (PCT/ISA/210) dated Jun. 28, 2018, with English translation.
(Continued)

*Primary Examiner* — Jonathan G Leong
*Assistant Examiner* — Tony S Chuo
(74) *Attorney, Agent, or Firm* — Birch, Stewart, Kolasch & Birch, LLP

(57) ABSTRACT

A negative electrode having a carbon-based thin film formed on at least one surface of a lithium metal layer, and a lithium secondary battery including the same. A carbon-based thin film formed on at least one surface of a lithium metal layer blocks side reactions caused by direct contact between the lithium metal layer and an electrolyte as well as increasing a specific surface area of a negative electrode, and thereby suppresses lithium dendrite formation, and by obtaining current density distribution uniformly, enhances cycle per-
(Continued)

formance, reduces an overvoltage to improve electrochemical performance of a lithium secondary battery.

10 Claims, 5 Drawing Sheets

(51) Int. Cl.
- *H01M 4/134* (2010.01)
- *H01M 4/38* (2006.01)
- *H01M 4/62* (2006.01)
- *H01M 10/052* (2010.01)
- *H01M 4/02* (2006.01)

(52) U.S. Cl.
CPC ........... *H01M 4/134* (2013.01); *H01M 4/382* (2013.01); *H01M 4/625* (2013.01); *H01M 4/628* (2013.01); *H01M 10/052* (2013.01); *H01M 2004/027* (2013.01)

(56) References Cited

U.S. PATENT DOCUMENTS

| | | |
|---|---|---|
| 2004/0058232 A1 | 3/2004 | Kim et al. |
| 2004/0096750 A1 | 5/2004 | Kim et al. |
| 2015/0349310 A1 | 12/2015 | Viner et al. |
| 2016/0006033 A1 | 1/2016 | Sheem |
| 2016/0020462 A1 | 1/2016 | Yang |
| 2016/0276671 A1 | 9/2016 | Yuge et al. |
| 2016/0344035 A1 | 11/2016 | Zhamu et al. |
| 2016/0380273 A1 | 12/2016 | Wu et al. |

FOREIGN PATENT DOCUMENTS

| | | | | |
|---|---|---|---|---|
| CN | 105833471 A | | 6/2016 | |
| CN | 105845891 A | | 8/2016 | |
| CN | 106328955 A | | 1/2017 | |
| CN | 106463678 A | | 2/2017 | |
| JP | 4-229562 A | | 8/1992 | |
| JP | H04229562 A | * | 8/1992 | |
| JP | 11-135116 A | | 5/1999 | |
| JP | 2004-119372 A | | 4/2004 | |
| JP | 2006-202594 A | | 8/2006 | |
| JP | 2010086733 A | * | 4/2010 | ............. H01M 4/06 |
| JP | JF 2010-086733 A | | 4/2010 | |
| KR | 10-2004-0026208 A | | 3/2004 | |
| KR | 10-2013-0067920 A | | 6/2013 | |
| KR | 20130067920 A | * | 6/2013 | ........ H01M 10/0525 |
| KR | 10-1517886 A | | 5/2015 | |
| KR | 10-2016-0005555 A | | 1/2016 | |
| KR | 10-2017-0012468 A | | 2/2017 | |
| KR | 10-1716574 B1 | | 3/2017 | |

OTHER PUBLICATIONS

Kim et al., "Charge-Discharge Characteristics of Physically Coated Lithium Anodes by Carbon Powders", Korean Chemical Engineering Research, vol. 49, No. 5, Oct. 2011, pp. 554-559, with partial translation.

Zhang et al., "Magnetron sputtering amorphous carbon coatings on metallic lithium: Towards promising anodes for lithium secondary batteries", Journal of Power Sources, vol. 266, May 14, 2014, pp. 43-50.

Indian Office Action for Appl. No. 201917021301 dated Feb. 16, 2021.

* cited by examiner

[Figure 1]
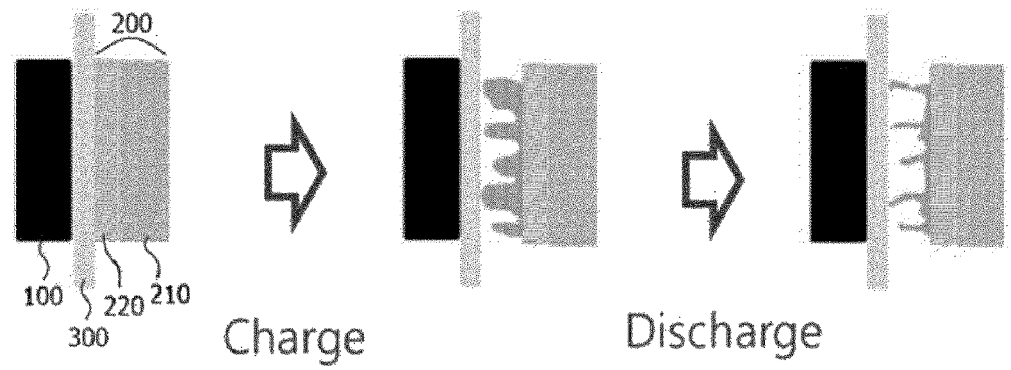
[Figure 2]
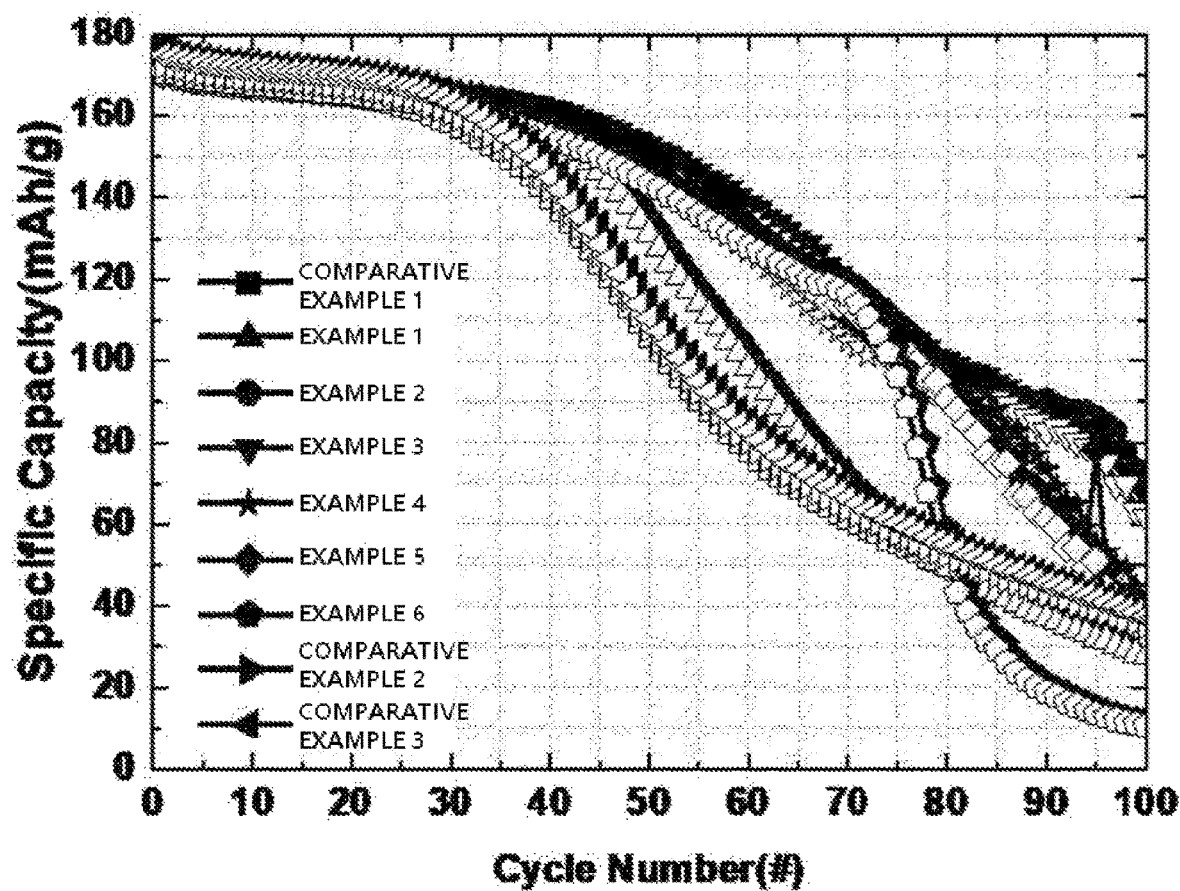

【Figure 3】
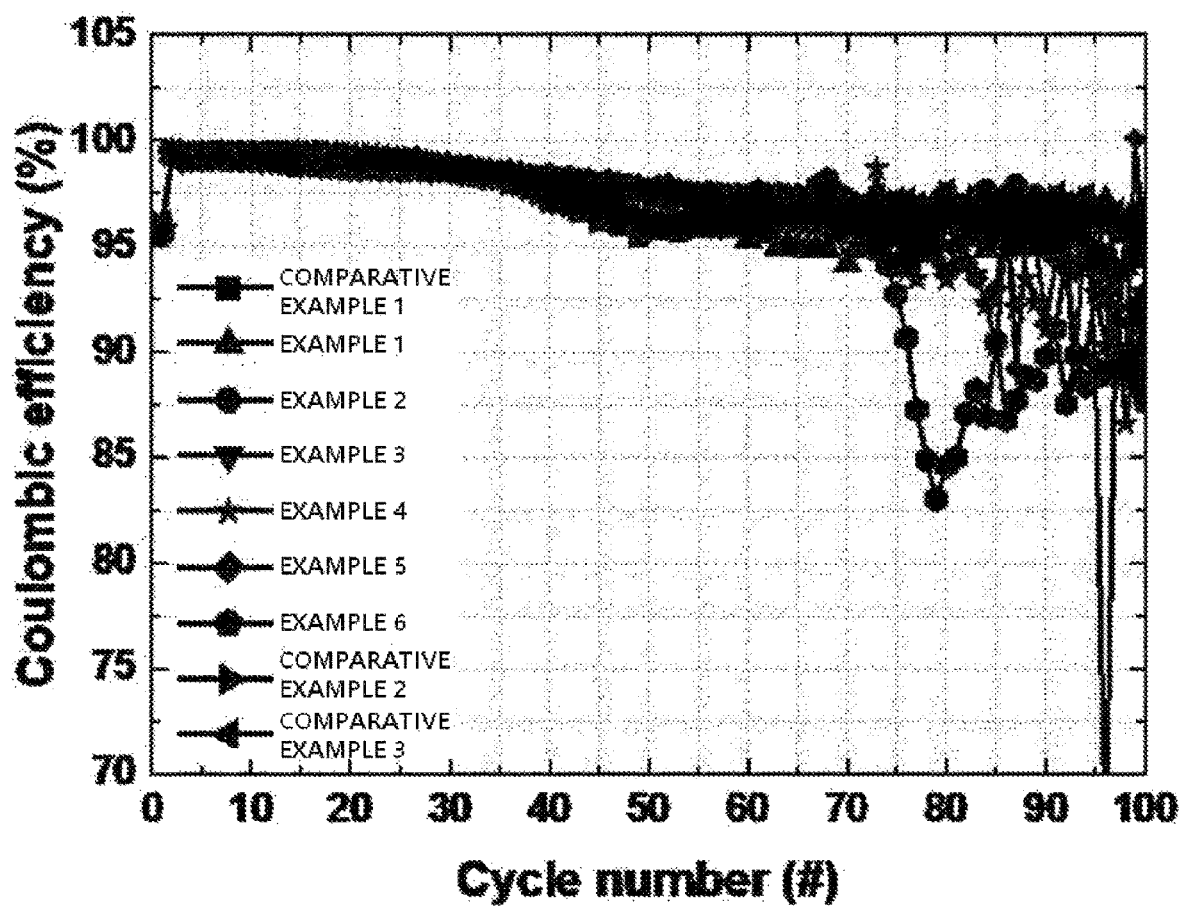

【Figure 4】
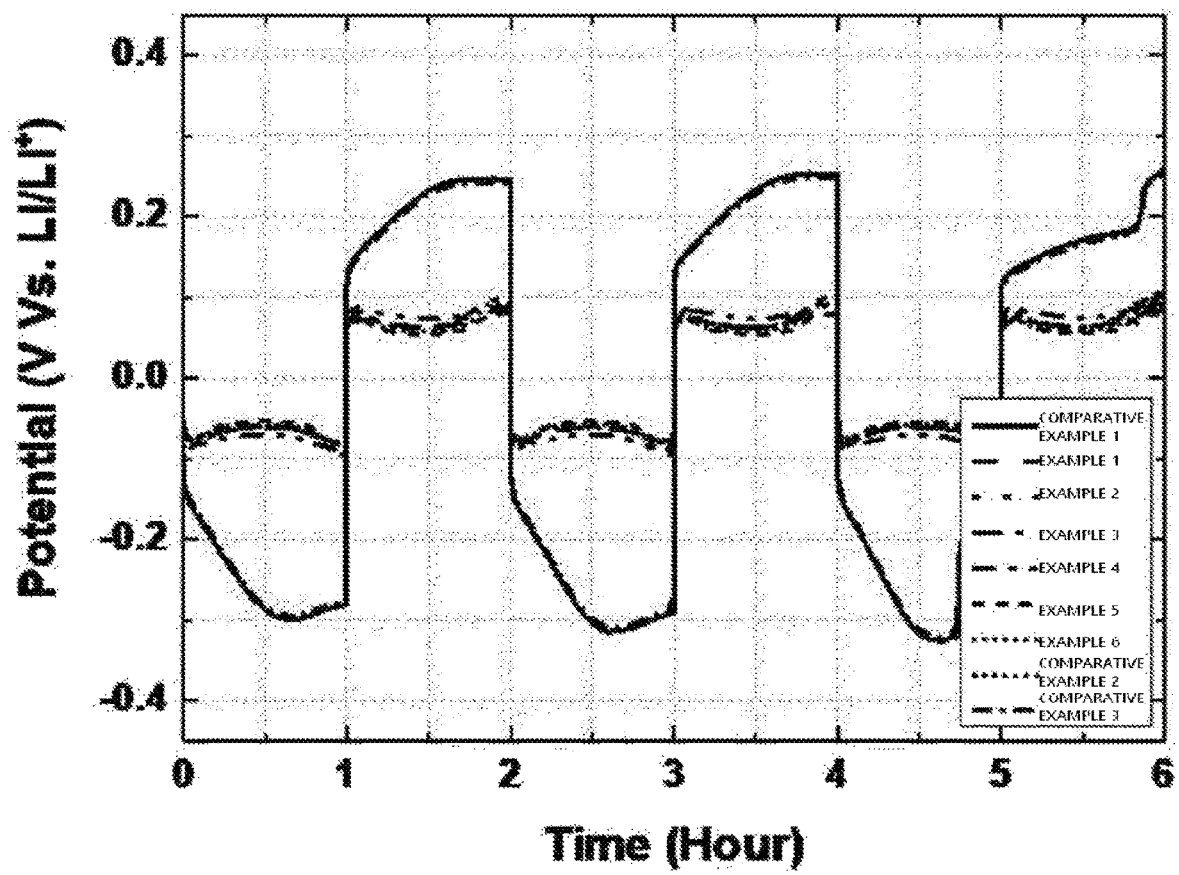

【Figure 5】
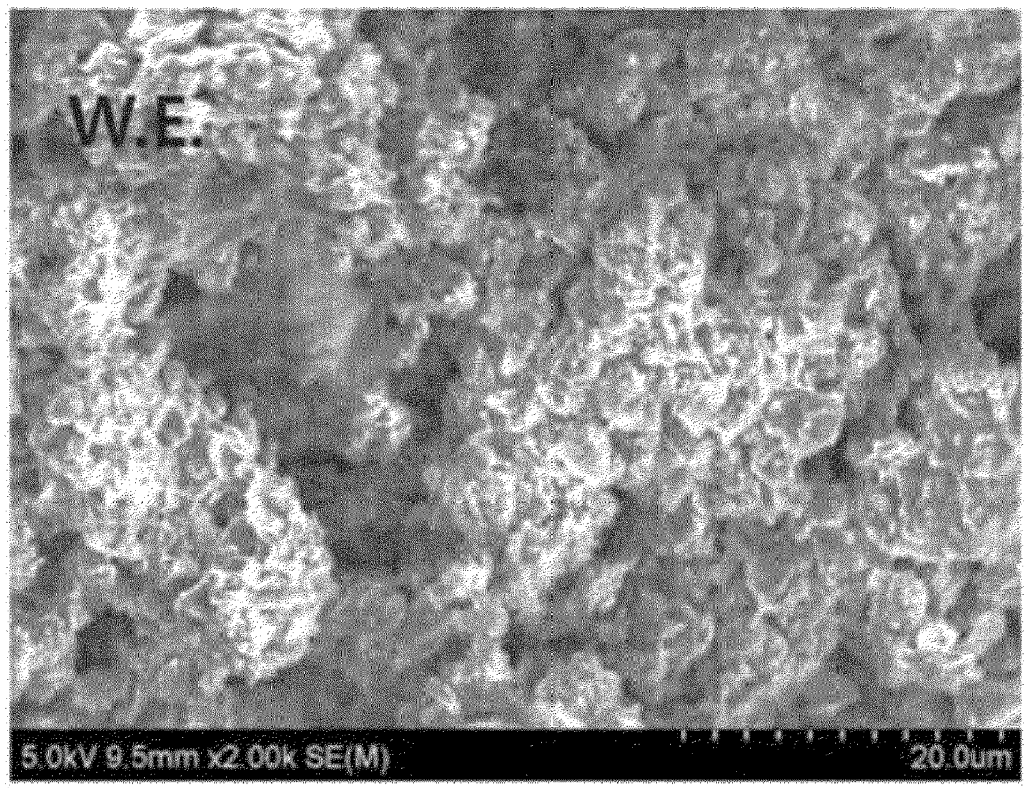
【Figure 6】
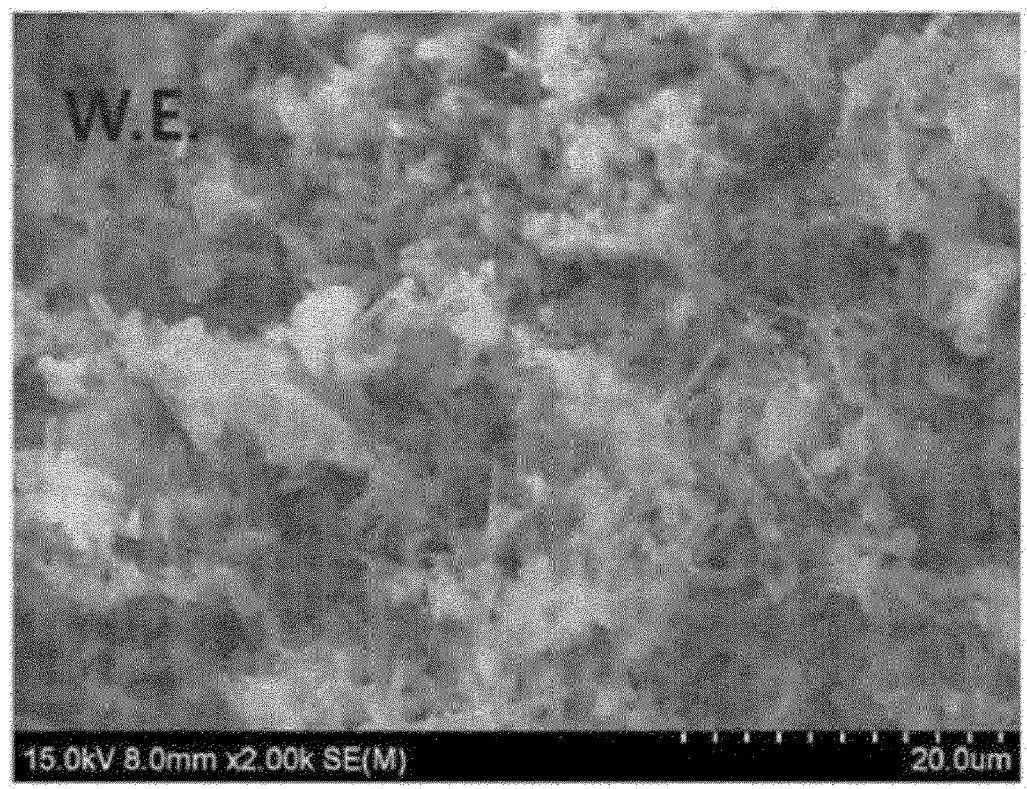

【Figure 7】
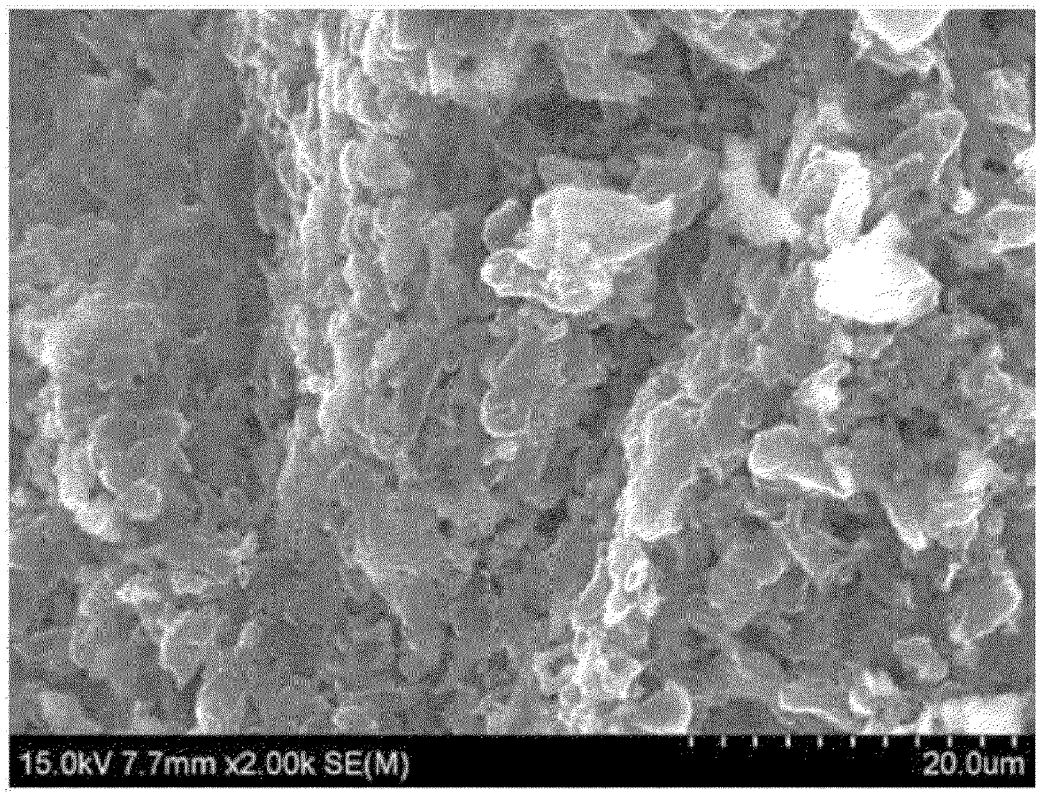
【Figure 8】
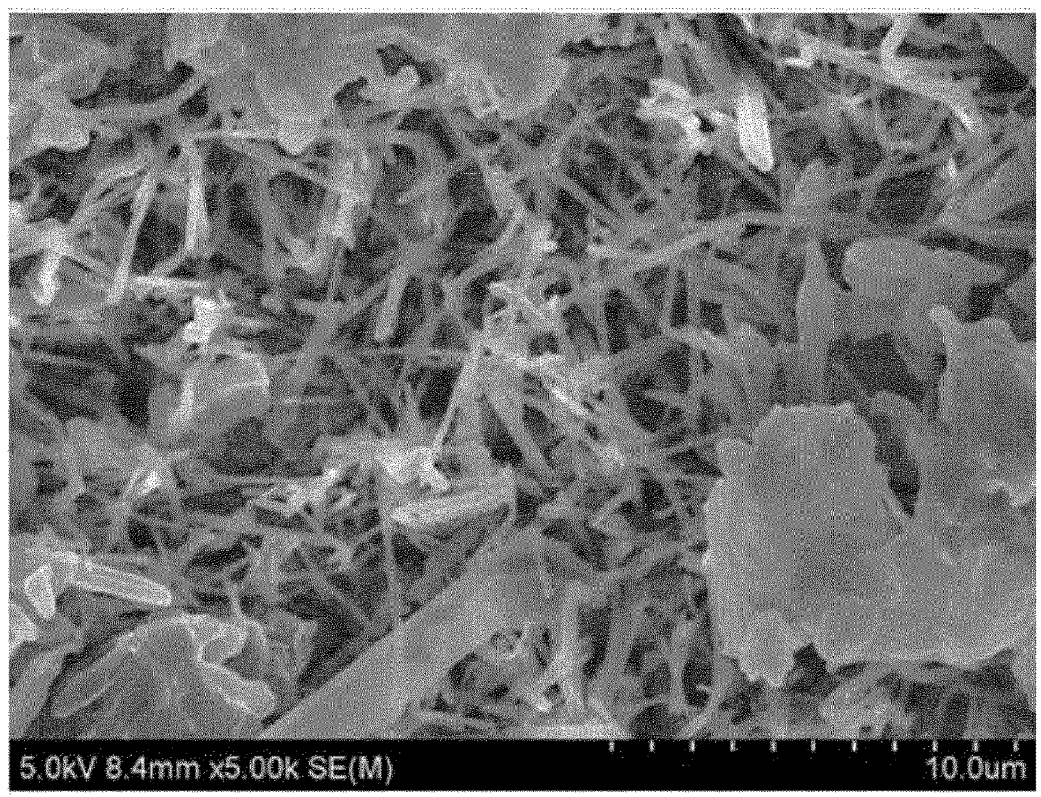

NEGATIVE ELECTRODE WITH CARBON-BASED THIN FILM, MANUFACTURING METHOD THEREFOR, AND LITHIUM SECONDARY BATTERY COMPRISING SAME

TECHNICAL FIELD

This application claims priority to and the benefits of Korean Patent Application No. 10-2017-0030399, filed on Mar. 10, 2017, and Korean Patent Application No. 10-2018-0026852, filed on Mar. 7, 2018, the disclosure of which are incorporated herein by reference its entirety.

The present invention relates to a negative electrode having a carbon-based thin film formed on at least one surface of a lithium metal layer, and a lithium secondary battery including the same.

BACKGROUND ART

Interests in energy storage technologies have been increasingly higher recently. As applications have expanded to energy of mobile phones, camcorders and notebook PCs, and furthermore, to electric vehicles, efforts on the research and development of electrochemical devices have been more and more materialized.

Electrochemical devices are fields receiving most attention in such aspects and among these, development of secondary batteries capable of charge and discharge have been the focus of attention, and developing such batteries has been progressed to research and development on the design of new electrodes and batteries for enhancing capacity density and energy efficiency.

Among currently used secondary batteries, lithium secondary batteries developed in early 1990s have received attention with advantages of having high operating voltage and significantly higher energy density compared to conventional batteries such as Ni—MH, Ni—Cd and sulfuric acid-lead batteries using an aqueous solution electrolyte liquid.

A lithium secondary battery is generally formed by embedding an electrode assembly including a positive electrode, a negative electrode and a separator provided between the positive electrode and the negative electrode into a battery case in a laminated or wound structure, and injecting a non-aqueous electrolyte liquid thereinto. In order to use a lithium electrode as a negative electrode, lithium foil is attached on a planar current collector.

Lithium dendrite is formed due to irregular lithium formation and removal while progressing charge and discharge in a lithium secondary battery, which leads to a continuous capacity decrease. In order to resolve such issues, studies such as introducing a polymer protective layer or an inorganic solid protective layer to a lithium metal layer, increasing a concentration of a salt of a electrolyte liquid, or using proper additives have been currently progressed. However, effects of lithium dendrite suppression of such studies are insignificant. Accordingly, modifying a form of a lithium metal negative electrode itself or modifying a structure of a battery may become an effective alternative in resolving the problems.

Prior Art Documents

Korean Patent Publication No. 10-2013-0067920 "Lithium secondary battery using negative electrode having carbon powder coated on lithium surface"

DISCLOSURE

Technical Problem

As described above, existing lithium secondary batteries aim to resolve problems of stability and performance decline caused by lithium dendrite formed on an electrode surface during charge and discharge. As a result of extensive studies in view of the above, the inventors of the present invention have identified that lithium dendrite formation is suppressed and lifetime properties may be improved when depositing a carbon-based thin film on at least one surface of a lithium metal layer, and have completed the present invention.

Accordingly, it is an object of the present invention to provide a negative electrode for a lithium secondary battery having a carbon-based thin film provided on an electrode surface, a method for preparing the same, and a lithium secondary battery including the same.

Technical Solution

In order to achieve the above object, the present invention provides a negative electrode for a lithium secondary battery including a lithium metal layer; and a carbon-based thin film deposited on at least one surface of the lithium metal layer, and having a thickness of 55 nm to 330 nm.

In addition, the present invention provides a method for preparing a negative electrode for a lithium secondary battery including forming a carbon-based thin film on at least one surface of a lithium metal layer, wherein the carbon-based thin film is deposited on at least one surface of the lithium metal layer using one or more methods selected from the group consisting of sputtering, evaporation, chemical vapor deposition (CVD), physical vapor deposition (PVD), atomic layer deposition (ALD) and arc discharge.

In addition, the present invention provides a lithium secondary battery including a positive electrode, a negative electrode and an electrolyte, wherein the negative electrode is the negative electrode of the present invention.

Advantageous Effects

According to the present invention, a carbon-based thin film formed on at least one surface of a lithium metal layer suppresses lithium dendrite formation by blocking side reactions caused by a direct contact between the lithium metal layer and an electrolyte as well as increasing a specific surface area of a negative electrode, and by obtaining current density distribution uniformly, enhances cycle performance and reduces an overvoltage to improve electrochemical performance of a lithium secondary battery.

DESCRIPTION OF DRAWINGS

FIG. 1 is a schematic view presenting an operation principle during charge and discharge of a lithium secondary battery including a negative electrode using a carbon-based thin film according to the present invention.

FIG. 2 is a graph presenting charge and discharge capacity with a cycle progress of lithium secondary batteries according to Examples 1 to 6 and Comparative Examples 1 to 3.

FIG. 3 is a graph presenting Coulombic efficiency with a cycle process of lithium secondary batteries according to Examples 1 to 6 and Comparative Examples 1 to 3.

FIG. 4 is a graph presenting a charge and discharge overvoltage behavior of lithium symmetric cells according to Examples 1 to 6 and Comparative Examples 1 to 3.

FIG. 5 is a negative electrode surface scanning electron microscope (SEM) image after progressing 200 cycles of a lithium symmetric cell according to Example 3.

FIG. 6 is a negative electrode surface scanning electron microscope (SEM) image after progressing 200 cycles of a lithium symmetric cell according to Comparative Example 1.

FIG. 7 is a negative electrode surface scanning electron microscope (SEM) image after progressing 200 cycles of a lithium symmetric cell according to Comparative Example 2.

FIG. 8 is a negative electrode surface scanning electron microscope (SEM) image after progressing 200 cycles of a lithium symmetric cell according to Comparative Example 3.

BEST MODE

Hereinafter, the present invention will be described in detail with reference to the accompanying drawings so that those skilled in the art may readily implement the present invention. However, the present invention will be embodied in various different forms, and is not limited to the present specification.

The present invention relates to a negative electrode for a lithium secondary battery including a lithium metal layer; and a carbon-based thin film deposited on at least one surface of the lithium metal layer, and having a thickness of 55 nm to 330 nm.

Lithium Metal Layer

The lithium metal layer according to the present invention may be a lithium metal plate, or a metal plate having an active layer including a lithium metal thin film or lithium formed on a negative electrode current collector. This means an active material layer in all ranges capable of forming lithium dendrite on the surface, and examples thereof may be one type selected from the group consisting of lithium metal, lithium alloys, lithium metal composite oxides, lithium-containing titanium composite oxides (LTO) and combinations thereof. The lithium alloy includes elements capable of alloying with lithium, and herein, the elements may be Si, Sn, C, Pt, Ir, Ni, Cu, Ti, Na, K, Rb, Cs, Fr, Be, Mg, Ca, Sr, Sb, Pb, In, Zn, Ba, Ra, Ge, Al, or an alloy thereof.

Lithium metal or a lithium alloy producing lithium dendrite by battery charge and discharge may be preferred, and lithium metal may be more preferred.

The lithium metal layer may be a sheet or foil, and, in some cases, may have a form of depositing or coating lithium metal or lithium alloy on a current collector using a dry process, or may have a form of depositing or coating particulate metal and alloy using a wet process.

Herein, the method of forming the lithium metal layer is not particularly limited, and known metal thin film forming methods such as a lamination method or a sputtering method may be used. In addition, assembling a battery with no lithium thin film on a current collector and then forming a metal lithium thin film on a metal plate by initial charge also belongs to the lithium metal layer of the present invention.

The negative electrode active material including the lithium in another active layer form instead of a thin film form is commonly prepared by a certain coating process by preparing to a slurry mixture and coating the mixture on a negative electrode current collector.

The lithium metal layer may have its width adjusted depending on the form of an electrode so that the electrode is readily prepared. The lithium metal layer may have a thickness of 1 μm to 500 μm, preferably 10 μm to 350 μm, and more preferably 50 μm to 200 μm. The lithium metal layer having a thickness of 1 μm to 500 μm may provide a sufficient lithium source, and thereby perform a role of helping with a cycle lifetime of a lithium secondary battery.

When necessary, the lithium metal layer may further include a current collector on one side, and specifically, the lithium metal layer may further include a current collector on one surface not adjoining a carbon-based thin film to describe later. Preferably, the lithium metal layer may be a negative electrode, and herein, a negative electrode current collector may be used as the current collector.

The negative electrode current collector is not particularly limited as long as it has high conductivity without inducing chemical changes to a battery, and may be selected from the group consisting of copper, aluminum, stainless steel, zinc, titanium, silver, palladium, nickel, iron, chromium, alloys thereof and combinations thereof. The stainless steel may have its surface treated with carbon, nickel, titanium or silver, and aluminum-cadmium alloys may be used as the alloy, and in addition thereto, baked carbon, nonconductive polymers of which surface is treated with a conductor, conductive polymers or the like may also be used. A copper thin plate is generally used as the negative electrode current collector. In addition, as the form, various forms such as films with/without micro-unevenness formed on the surface, sheets, foil, nets, porous bodies, foams and non-woven fabrics may be used.

In addition, as the negative electrode current collector, those having a thickness range of 3 μm to 500 μm are used. When the negative electrode current collector has a thickness of less than 3 μm, a current collecting effect decreases, and the thickness being greater than 500 μm has a problem of processability decline when assembling a cell through folding.

FIG. 1 is a schematic view presenting an operation principle during charge and discharge of a lithium secondary battery including a negative electrode using a carbon-based thin film according to the present invention. When using lithium metal as a negative electrode, electron density non-uniformization may occur on the lithium metal surface during battery operation due to various reasons. As a result, a branch-shaped lithium dendrite is formed on the electrode surface causing formation and growth of projections on the electrode surface making the electrode surface very rough. Such lithium dendrite causes, together with battery performance decline, separator (300) damages and battery short circuits in severe cases. As a result, a temperature in the battery increases causing risks of battery explosion and fire. In view of the above, the present invention introduces a carbon-based thin film (220) having a specific thickness range on a surface of the lithium metal layer (210) to prevent a direct contact between the lithium metal layer (210) and an electrolyte, and aims to enhance battery stability by suppressing growth of lithium dendrite generated on the lithium metal surface.

Carbon-Based Thin Film

The carbon-based thin film (220) according to the present invention is formed on at least one surface of the lithium metal layer (210) described above, and reacts with inactive lithium or lithium dendrite that is not involved in charge and discharge on the negative electrode to absorb using a method of forming a lithium-intercalated material and the like. Accordingly, an internal short circuit of a battery is prevented, and cycle lifetime properties are enhanced during charge and discharge.

When the carbon material, a lithium dendrite-absorbing material, aggregates by being brought into contact with each other, a conductive network is formed, and accordingly, the conductive network is charged first before charging the negative electrode. As a result, the amount of lithium dendrite absorption decreases causing decline in the battery cycle properties. Accordingly, it is preferred that the carbon material, a lithium dendrite-absorbing material, be uniformly distributed.

The carbon-based thin film (220) according to the present invention is formed to have a thickness of 55 nm to 330 nm, preferably 110 nm to 275 nm, more preferably 110 nm to 220 nm, and most preferably 110 nm to 165 nm. When the carbon-based thin film (220) has a thickness of less than 55 nm, the role of a protective layer is not properly performed causing cracks, and the thickness being greater than 330 nm has a problem of reducing energy density by increasing a thickness of the whole negative electrode.

The carbon-based thin film (220) according to the present invention may be prepared by employing a method of dry deposition. Compared to a wet deposition method, such a dry deposition method may increase purity of the carbon material included in the carbon-based thin film (220) since additional materials such as a binder are not added, and may widen a surface area and exhibit current density distribution uniformly since high porosity is evenly provided on the deposited carbon-based thin film (220).

Nonlimiting examples of such a dry deposition method may include one or more methods selected from the group consisting of sputtering, an evaporation method, a chemical vapor deposition (CVD) method, a physical vapor deposition (PVD) method, an atomic layer deposition (ALD) method and arc discharge, and preferably, a sputtering method is used.

Specifically, as the sputtering, one or more methods among DC sputtering, RF sputtering, ion beam sputtering, bias sputtering and magnetron sputtering may be used.

When forming the carbon-based thin film (220) using the sputtering method, a coating layer having a uniform thickness may be formed without causing any change on the lithium metal layer (210). In addition, the carbon-based thin film (220) prepared using the same is deposited with the lithium metal layer (210) with excellent adhesion without defects such as pores and cracks, and therefore, an additional thin film such as an adhesive material, or an additional process such as heat treatment is not required. Accordingly, preparing the carbon-based thin film (220) by sputtering is preferred since time and costs may be reduced.

By controlling process parameters of the sputtering method, a microstructure, a thickness and the like of the carbon-based thin film (220) may be controlled. Specifically, other process parameters such as a process gas, a process pressure, input energy of a target, a cooling condition in a deposition process, geometry of sputtering or deposition time may be controlled.

Examples of the process gas used in the sputtering according to the present invention preferably include one or more types of gases selected from the group consisting of argon (Ar), helium (He), nitrogen ($N_2$), ammonia ($NH_3$), oxygen ($O_2$), nitrogen trifluoride ($NF_3$) and methane trifluoride ($CHF_3$).

The sputtering may use commonly employed conditions, and according to one embodiment, and preparation may be made with carbon as a sputtering target under a condition of an inert gas flow rate of 5 sccm (standard cubic centimeters per minute) to 1000 sccm, a pressure of 0.1 mTorr to 10 mTorr, and a substrate temperature of 400° C. to 1200° C., and the inert gas is preferably argon (Ar) gas.

In addition, the sputtering is carried out for 20 minutes to 120 minutes, preferably for 40 minutes to 100 minutes, more preferably for 40 minutes to 80 minutes, and most preferably for 40 minutes to 60 minutes under the above-mentioned condition. When the deposition time is shorter than 20 minutes, the carbon-based thin film (220) is too thin, and the role of a protective layer is not properly performed causing cracks, and the deposition time being longer than 120 minutes has a problem of reducing energy density by increasing a thickness of the carbon-based thin film (220).

After the deposition, a heat treatment process may be selectively performed as necessary. Herein, the heat treatment temperature may be from 800° C. to 1500° C. Specifically, a heat treatment process by rapid thermal anneal having a temperature raising rate of 5° C./sec to 300° C./sec to a heat treatment temperature is preferred. Such a heat treatment process may induce uniform pore alignment through a self-assembly of deposited carbon particles.

The carbon-based thin film (220)-formed lithium electrode may be rolled. The rolling may be carried out using common methods, and for example, a method of rolling with a pressure roller provided in a roll press and the like, or rolling across the whole electrode surface using a plate press may be used. Particularly, such a rolling process may apply a pressure of 10 kg/cm$^2$ to 100 ton/cm$^2$, and heat with a temperature of 100° C. to 200° C. The heat treatment at the above-mentioned temperature includes heating while performing a rolling process, or performing a rolling process in a state heated before performing the rolling process as well.

The carbon-based thin film (220) formed as above may be amorphous carbon. Specifically, hard carbon, corks, mesocarbon microbead (MCMB) baked at 1500° C. or lower, or mesophase pitch-based carbon fiber (MPCF) may be included, and preferably, the carbon-based thin film (220) is formed with hard carbon. The carbon-based thin film (220) formed with such amorphous carbon has advantages of suppressing lithium dendrite growth and increasing reversibility by facilitating lithium ion flux and current density distribution through widening a specific surface area of the carbon-based thin film (220) while maintaining high electrical conductivity.

Organosulfur Protective Layer

According to the present invention, the carbon-based thin film (220) may additionally further include, in order to suppress growth of dendrite formed on the lithium metal layer (210) surface, an organosulfur protective layer (not shown) including an organosulfur compound either on one surface of the carbon-based thin film (220) not adjoining the lithium metal layer (210) or between the carbon-based thin film (220) and the lithium metal layer (210). Such a protective layer enhances battery lifetime properties by preventing formation of dendrite formed on the lithium metal surface during charge, and may prevent a lithium metal oxidation by blocking a direct contact with moisture or oxygen in the air on the lithium metal surface.

As the organosulfur compound, thiol group-containing monomers or polymers may all be used, however, monomers are preferred since more thiol groups are included therein.

Specific examples of the organosulfur compound may include one or more types of compounds selected from the group consisting of 2,5-dimercapto-1,3,4-thiadiazole, bis(2-mercapto-ethyl)ether, N,N'-dimethyl-N,N'-dimercaptoethylene-diamine, N,N,N',N'-tetramercapto-ethylenediamine, 2,4,6-trimercaptotriazole, N,N'-dimercapto-piperazine, 2,4-dimercaptopyrimidine, 1,2-ethanedithiol and bis(2-mercapto-ethyl)sulfide. Among these, 2,5-dimercapto-1,3,4-thiadiazole is preferred.

The organosulfur compound preferably contains a thiol group at the end group, and such an organosulfur compound having a thiol group is advantageous for coating since a complex is readily formed with lithium metal. In addition, S or N having high electronegativity is included in large quantities readily coordinating lithium ions, and dendrite formation may be suppressed by making the lithium ions uniformly precipitated (deposited) on the lithium metal surface during charge.

The organosulfur protective layer includes the organosulfur compound preferably in 50% by weight to 100% by weight and more preferably in 50% by weight to 70% by weight with respect to the total weight of the organosulfur protective layer. When the amount of the organosulfur compound is less than 50% by weight, coating effects may not be sufficiently obtained.

In addition, the organosulfur protective layer may further include an electron conducting polymer for facilitating cation transport while providing electron conductivity.

As the electron conducting polymer, one or more types of compounds selected from the group consisting of polyaniline, poly(p-phenylene), polythiophene, poly(3-alkylthiophene), poly(3-alkoxythiophene), poly(crown ether thiophene), polypyrrole, poly(dialkyl-2,2'-bipyridine), polypyridine, polyalkylpyridine, poly(2,2'-bipyridine), poly(dialkyl-2,2'-bipyridine), polypyrimidine, polydihydrophenanthrene, polyquinoline, polyisoquinoline, poly(1,2,3-benzothiadiazole), poly(benzimidazole), poly(quinoxaline), poly(2,3-diarylquinoxaline), poly(1,5-naphthyridine), poly(1,3-cyclohexadiene), poly(anthraquinone), poly(Z-methyl-anthraquinone), poly(ferrocene) and poly(6,6'-biquinoline) may be included. Herein, the alkyl group means aliphatic hydrocarbon having 1 to 8 carbon atoms. When the hydrocarbon of the electron conducting polymer is substituted with a sulfone group, cation transport may be more effectively facilitated.

The method of forming the organosulfur protective layer on one surface of the carbon-based thin film (220) is not limited, however, as a wet coating, methods of spin coating, dipping, spray or casting may be preferably used as the coating method, but the method is not limited thereto. After the coating, the result is vacuum dried and rolled to prepare an organosulfur compound layer-coated lithium metal negative electrode.

Method for Preparing Negative Electrode for Lithium Secondary Battery

In addition, the present invention relates to a method for preparing a negative electrode for a lithium secondary battery including forming a carbon-based thin film on at least one surface of a lithium metal layer, wherein the carbon-based thin film is deposited on at least one surface of the lithium metal layer using one or more methods selected from the group consisting of sputtering, evaporation, chemical vapor deposition (CVD), physical vapor deposition (PVD), atomic layer deposition (ALD) and arc discharge.

Methods and conditions of the carbon-based thin film deposition are the same as described above in the carbon-based thin film.

Lithium Secondary Battery

In the lithium secondary battery according to the present invention, constitutions other than structures and properties of the negative electrode described above may be prepared through known technologies implemented by those skilled in the art, and the constitutions will be specifically described hereinafter.

A positive electrode (100) according to the present invention may be prepared to a positive electrode form by film-forming a composition including a positive electrode active material, a conductor and a binder on a positive electrode current collector.

The positive electrode active material may vary depending on the application of a lithium secondary battery, and known materials are used as the specific composition. As one example, the positive electrode active material may include any one lithium transition metal oxide selected from the group consisting of lithium cobalt-based oxides, lithium manganese-based oxides, lithium copper oxide, lithium nickel-based oxides, lithium manganese composite oxides and lithium-nickel-manganese-cobalt-based oxides, and more specifically, may include lithium manganese oxides such as $Li_{1+x}Mn_{2-x}O_4$ (herein, x is 0 to 0.33), $LiMnO_3$, $LiMn_2O_3$ or $LiMnO_2$; lithium copper oxide ($Li_2CuO_2$); lithium vanadium oxides such as $LiV_3O_8$, $LiFe_3O_4$, $V_2O_5$ or $Cu_2V_2O_7$; lithium nickel oxides represented by $LiNi_{1-x}M_xO_2$ (herein, M=Co, Mn, Al, Cu, Fe, Mg, B or Ga, and x=0.01 to 0.3); lithium manganese composite oxides represented by $LiMn_{2-x}MxO_2$ (herein, M=Co, Ni, Fe, Cr, Zn or Ta, and x=0.01 to 0.1) or $Li_2Mn_3MO_8$ (herein, M=Fe, Co, Ni, Cu or Zn), lithium-nickel-manganese-cobalt-based oxides represented by $Li(Ni_aCo_bMn_c)O_2$ (herein, $0<a<1$, $0<b<1$, $0<c<1$, $a+b+c=1$), $Fe_2(MoO_4)_3$; elemental sulfur, disulfide compounds, organosulfur protective layers (organosulfur compounds) and carbon-sulfur polymers $((C_2S_x)_n: x=2.5$ to 50, $n=2)$; graphite-based materials; carbon black-based materials such as Super-P, denka black, acetylene black, ketjen black, channel black, furnace black, lamp black, thermal black or carbon black; carbon derivatives such as fullerene; conductive fibers such as carbon fiber or metal fiber; fluorinated carbon, aluminum, metal powder such as nickel powder; conductive polymers such as polyaniline, polythiophene, polyacetylene or polypyrrole; forms supporting a catalyst such as Pt or Ru on a porous carbon support, or the like. However, the positive electrode active material is not limited thereto.

The conductor is a component for further enhancing conductivity of the positive electrode active material, and nonlimiting examples thereof may include graphite such as natural graphite or artificial graphite; carbon black such as carbon black, acetylene black, ketjen black, channel black, furnace black, lamp black or thermal black; conductive fibers such as carbon fiber or metal fiber; fluorinated carbon, aluminum, metal powder such as nickel powder; conductive whiskers such as zinc oxide or potassium titanate; conductive metal oxides such as titanium oxide; conductive materials such as polyphenylene derivatives, and the like.

The positive electrode (100) may further include a binder for binding of the positive electrode active material and the conductor and for binding on the current collector. The binder may include a thermoplastic resin or a thermosetting resin. For example, polyethylene, polypropylene, polytetrafluoroethylene (PTFE), polyvinylidene fluoride (PVDF), styrene-butadiene rubber, a tetrafluoroethylene-perfluoro alkylvinyl ether copolymer, a vinylidene fluoride-hexafluoropropylene copolymer, a vinylidene fluoride-chlorotrifluoroethylene copolymer, an ethylene-tetrafluoroethylene copolymer, a polychlorotrifluoroethylene, vinylidene fluoride-pentafluoropropylene copolymer, a propylene-tetrafluoroethylene copolymer, an ethylene-chlorotrifluoroethylene copolymer, a vinylidene fluoride-hexafluoropropylene-tetrafluoroethylene copolymer, a vinylidene fluoride-per fluoromethylvinyl ether-tetrafluoroethylene copolymer, an ethylene-acrylic acid copolymer and the like may be used either alone or as a mixture, however, the binder is not limited thereto, and those capable of being used as a binder in the art may all be used.

The positive electrode current collector is the same as described in the negative electrode current collector, and an aluminum thin plate may be generally used as the positive electrode current collector.

Such a positive electrode (100) may be prepared using common methods, and specifically, may be prepared by coating a composition for forming a positive electrode active material layer prepared by mixing a positive electrode active material, a conductor and a binder in an organic solvent on a current collector and drying the result, and selectively, compression molding the result on the current collector for enhancing electrode density. Herein, as the organic solvent, those capable of uniformly dispersing the positive electrode active material, the binder and the conductor, and readily evaporating are preferably used. Specifically, acetonitrile, methanol, ethanol, tetrahydrofuran, water, isopropyl alcohol and the like may be included.

The positive electrode composition may be coated on the positive electrode current collector using common methods known in the art, and for example, various methods such as a dipping method, a spray method, a roll coat method, a gravure printing method, a bar coat method, a die coating method, a comma coating method or a mixed method thereof may be used.

The positive electrode and the positive electrode composition that have gone through such a coating process go through solvent or dispersion medium evaporation, compactness of the coating layer and adhesion between the coating layer and the current collector through a drying process afterward. Herein, the drying is carried out using a common method, and is not particularly limited.

A common separator (300) may be provided between the positive electrode (100) and the negative electrode (200). The separator (300) is a physical separator having a function of physically separating electrodes, and those commonly used as a separator may be used without particular limit, and particularly, those having an excellent electrolyte liquid moisture retention ability while having low resistance for ion migration of the electrolyte liquid are preferred.

In addition, the separator (300) enables lithium ion transfer between the positive electrode (100) and the negative electrode (200) while separating or insulating the positive electrode (100) and the negative electrode (200) from each other. Such a separator (300) may be formed with porous, and non-conductive or insulating materials. The separator (300) may be an independent member such as a film, or a coating layer added to the positive electrode (100) and/or the negative electrode (200).

As the separator, a polyolefin-based non-woven fabric may be used, and for example, membranes formed with a polymer using a polyolefin-based polymer such as polyethylene such as high density polyethylene, linear low density polyethylene, low density polyethylene and ultra-high molecular weight polyethylene, polypropylene, polybutylene and polypentene alone, or formed with a polymer mixing these may be included.

As the non-woven fabric other than the polyolefin-based non-woven fabric described above, non-woven fabrics formed with a polymer using, for example, polyphenylene oxide, polyimide, polyamide, polycarbonate, polyethylene terephthalate, polyethylene naphthalate, polybutylene terephthalate, polyphenylene sulfide, polyacetal, polyether sulfone, polyetheretherketone, polyester and the like alone, or formed with a polymer mixing these may be used, and, as a fiber form forming a porous web, such a non-woven fabric includes a spunbond or meltblown form formed with long fibers.

The thickness of the separator (300) is not particularly limited, but is preferably in a range of 1 μm to 100 μm and more preferably in a range of 5 μm to 50 μm. When the separator (300) has a thickness of less than 1 μm, mechanical properties may not be maintained, and when the thickness is greater than 100 μm, the separator (300) functions as a resistive layer declining battery performance.

A pore size and porosity of the separator (300) are not particularly limited, however, the pore size is preferably from 0.1 μm to 50 μm, and the porosity is preferably from 10% to 95%. When the separator (300) has a pore size of less than 0.1 μm or porosity of less than 10%, the separator (300) functions as a resistive layer, and when the pore size is greater than 50 μm or the porosity is greater than 95%, mechanical properties may not be maintained.

The electrolyte liquid of the lithium secondary battery is a lithium-salt containing electrolyte liquid, and may be an aqueous or non-aqueous electrolyte liquid, is preferably a non-aqueous electrolyte formed with an organic solvent electrolyte liquid and a lithium salt. In addition thereto, an organic solid electrolyte, an inorganic solid electrolyte or the like may be included, however, the electrolyte liquid is not limited thereto.

As the lithium salt, those commonly used in an electrolyte liquid for a lithium secondary battery may be used without limit. For example, an anion of the lithium salt may include any one selected from the group consisting of $F^-$, $Cl^-$, $Br^-$, $I^-$, $NO_3^-$, $N(CN)_2^-$, $BF_4^-$, $ClO_4^-$, $PF_6^-$, $(CF_3)_2PF_4^-$, $(CF_3)_3PF_3^-$, $(CF_3)_4PF_2^-$, $(CF_3)_5PF^-$, $(CF_3)_6P^-$, $CF_3SO_3^-$, $CF_3CF_2SO_3^-$, $(CF_3SO_2)_2N^-$, $(FSO_2)_2N^-$, $CF_3CF_2(CF_3)_2CO^-$, $(CF_3SO_2)_2CH^-$, $(SF_5)_3C^-$, $(CF_3SO_2)_3C^-$, $CF_3(CF_2)_7SO_3^-$, $CF_3CO_2^-$, $CH_3CO_2^-$, $SCN^-$ and $(CF_3CF_2SO_2)_2N^-$, or two or more types among these.

As the organic solvent included in the non-aqueous electrolyte liquid, those commonly used in electrolyte liquids for a lithium secondary battery may be used without limit, and for example, ether, ester, amide, linear carbonate, cyclic carbonate and the like may be used either alone, or as a mixture of two or more types. Among these, a carbonate compound that is cyclic carbonate, linear carbonate or a mixture thereof may be typically included.

Specific examples of the cyclic carbonate compound may include any one selected from the group consisting of ethylene carbonate (EC), propylene carbonate (PC), 1,2-butylene carbonate, 2,3-butylene carbonate, 1,2-pentylene carbonate, 2,3-pentylene carbonate, vinylene carbonate, vinyl ethylene carbonate and halides thereof, or a mixture of two or more types thereof. Examples of the halides thereof may include fluoroethylene carbonate (FEC) and the like, but are not limited thereto.

Specific examples of the linear carbonate compound may typically include any one selected from the group consisting of dimethyl carbonate (DMC), diethyl carbonate (DEC), dipropyl carbonate, ethylmethyl carbonate (EMC), methylpropyl carbonate and ethylpropyl carbonate, or a mixture of two or more types thereof, but are not limited thereto.

Particularly, among the carbonate-based organic solvents, ethylene carbonate and propylene carbonate that are cyclic carbonate are a highly viscous organic solvent and have a high dielectric constant, and therefore, may more favorably dissociate a lithium salt in an electrolyte, and when mixing and using linear carbonate having low viscosity and low dielectric constant such as dimethyl carbonate and diethyl carbonate in a proper ratio to such cyclic carbonate, an electrolyte liquid having higher electrical conductivity may be prepared.

In addition, as the ether among the organic solvents, any one selected from the group consisting of dimethyl ether, diethyl ether, dipropyl ether, methylethyl ether, methylpropyl ether and ethylpropyl ether, or a mixture of two or more types thereof may be used, however, the ether is not limited thereto.

As the ester among the organic solvents, any one selected from the group consisting of methyl acetate, ethyl acetate, propyl acetate, methyl propionate, ethyl propionate, propyl propionate, γ-butyrolactone, γ-valerolactone, γ-caprolactone, σ-valerolactone and ε-caprolactone, or a mixture of two or more types thereof may be used, however, the ester is not limited thereto.

The non-aqueous electrolyte liquid may be injected at a proper stage in an electrochemical device manufacturing process depending on a manufacturing process and required properties of a final product. In other words, the non-aqueous electrolyte liquid may be injected at a stage prior to assembling an electrochemical device or at a final stage of electrochemical device assembly.

The lithium secondary battery according to the present invention may go through lamination (stack) and folding processes of a separator and an electrode in addition to winding, a general process. In addition, the battery case may be a cylinder-type, a square-type, a pouch-type, a coin-type or the like.

Herein, depending on the positive electrode (100) material and the separator (300) type, the lithium secondary battery may be divided into various batteries such as a lithium-sulfur battery, a lithium-air battery, a lithium-oxide battery or a lithium all-solid-state battery, and depending on the shape, may be divided into a cylinder-type, a square-type, a coin-type, a pouch-type and the like, and depending on the size, may be divided into a bulk type and a thin film type. Structures and manufacturing methods of these batteries are widely known in the art, and therefore, detailed descriptions thereon are not included.

The lithium secondary battery according to the present invention may be used as a power supply of devices requiring high stability. Specific examples of the device may include power tools operated through receiving electric power by a battery motor; electric vehicles including electric vehicles (EV), hybrid electric vehicles (HEV), plug-in hybrid electric vehicles (PHEV) and the like; electric two-wheeled vehicles including e-bikes, e-scooters and the like; electric golf carts; systems for power storage and the like, but are not limited thereto.

Hereinafter, the present invention will be described in detail with reference to examples in order to specifically describe the present invention. However, the examples according to the present specification may be modified to various different forms, and the scope of the present invention is not construed as being limited to the examples described below. The examples of the present invention are provided in order to more fully describe the present invention for those having average knowledge in the art.

Example 1

1) Preparation of Negative Electrode

On a lithium foil surface having a thickness of 150 μm, a carbon-based thin film was deposited by RF sputtering for minutes under the following condition to prepare a negative electrode.

Target diameter: 2" dia
Substrate-target distance: 5 cm
Sputter gas: Ar
Sputter gas pressure: 0.75 mTorr
Flow rate of introduced sputter gas: 500 sccm
Sputtering power density: 8.5 W/cm$^2$
Frequency of alternating current voltage applied to electrode: 40 kHz 2) Manufacture of Lithium Secondary Battery Lithium cobalt oxide (LCO) was used as a working electrode, and the negative electrode prepared in 1) was used as a counter electrode. After providing a polyolefin separator between the electrodes, an electrolyte liquid prepared by dissolving 1 M LiPF$_6$ in a solvent mixing ethylene carbonate (EC) and ethylmethyl carbonate (EMC) in a volume ratio of 50:50 was injected thereto to manufacture a coin-type half-cell.

3) Manufacture of Lithium Symmetric Cell

Lithium metal having a thickness of 150 μm was used as a working electrode, and the negative electrode prepared in 1) was used as a counter electrode. After providing a polyolefin separator between the electrodes, an electrolyte liquid prepared by dissolving 1 M LiPF$_6$ in a solvent mixing ethylene carbonate (EC) and ethylmethyl carbonate (EMC) in a volume ratio of 50:50 was injected thereto to manufacture a coin-type half-cell.

Example 2

A negative electrode, a lithium secondary battery and a lithium symmetric cell were manufactured in the same manner as in Example 1 except that the deposition was carried out for 40 minutes.

Example 3

A negative electrode, a lithium secondary battery and a lithium symmetric cell were manufactured in the same manner as in Example 1 except that the deposition was carried out for 60 minutes.

Example 4

A negative electrode, a lithium secondary battery and a lithium symmetric cell were manufactured in the same manner as in Example 1 except that the deposition was carried out for 80 minutes.

Example 5

A negative electrode, a lithium secondary battery and a lithium symmetric cell were manufactured in the same manner as in Example 1 except that the deposition was carried out for 100 minutes.

Example 6

A negative electrode, a lithium secondary battery and a lithium symmetric cell were manufactured in the same manner as in Example 1 except that the deposition was carried out for 120 minutes.

Comparative Example 1

A negative electrode, a lithium secondary battery and a lithium symmetric cell were manufactured in the same manner as in Example 1 except that a lithium thin film was used as the counter electrode.

Comparative Example 2

A negative electrode, a lithium secondary battery and a lithium symmetric cell were manufactured in the same manner as in Example 1 except that the deposition was carried out for 5 minutes.

Comparative Example 3

A negative electrode, a lithium secondary battery and a lithium symmetric cell were manufactured in the same manner as in Example 1 except that the deposition was carried out for 200 minutes.

Experimental Example 1: Measurement of Electrochemical Charge and Discharge Capacity, Lifetime (Cycle) Properties and Efficiency For the lithium secondary batteries of Examples 1 to 6 and Comparative Examples 1 to 3, charge capacity and discharge capacity during a charge/discharge process were measured by employing a charging voltage of 5 V cut and a charging time of 1 hour, and fixing a discharging voltage at −1 V cut and a discharging time at 1 hour, and resulting lifetime properties are shown in the following Table 1 and FIG. 2. Capacity efficiency was calculated therethrough and the results are shown in FIG. 3.

TABLE 1

| | Deposition Time (Minutes) | Thin Film Thickness (nm) | Charge/Discharge Capacity Retention Rate (%) at $50^{th}$ Cycle | Charge/Discharge Capacity Retention Rate (%) at $100^{th}$ Cycle |
|---|---|---|---|---|
| Comparative Example 1 | 0 | 0 | 62.2 | 19.2 |
| Comparative Example 2 | 5 | 20 | 62.8 | 20.4 |
| Example 1 | 20 | 55 | 77.2 | 16.6 |
| Example 2 | 40 | 110 | 86.9 | 36.5 |
| Example 3 | 60 | 165 | 87.6 | 36.4 |
| Example 4 | 80 | 220 | 84.7 | 23.5 |
| Example 5 | 100 | 275 | 85.7 | 19.4 |
| Example 6 | 120 | 330 | 84.1 | 6.2 |
| Comparative Example 3 | 200 | 400 | 63.3 | 21.5 |

When referring to Table 1 and FIG. 2, it was identified that, at the point of 50th cycle, the charge/discharge capacity retention rate all increased in Examples 1 to 6 compared to Comparative Examples 1 to 3. Among these, having a charge/discharge capacity retention rate of 80% or greater based on the 50th cycle was Examples 2 to 6 having a thin film thickness of 110 nm to 330 nm.

In addition, it was identified that, at the point of $100^{th}$ cycle, having a significantly increased charge/discharge capacity retention rate compared to Comparative Examples 1 to 3 was Examples 2 to 4 having a thin film thickness of 110 nm to 220 nm, and among these, having a charge/discharge capacity retention rate of 30% or greater based on the $100^{th}$ cycle was Examples 2 and 3 having a thin film thickness of 110 nm to 165 nm.

Accordingly, considering both the 50th cycle and the $100^{th}$ cycle, it was identified that the carbon-based thin film having a thickness of preferably 110 nm to 220 nm, and most preferably 110 nm to 165 nm significantly increased a capacity retention rate.

Experimental Example 2: Measurement of Electrochemical Charge and Discharge Overvoltage Behavior An overvoltage behavior when Li plating/stripping was identified by repeating charge/discharge (current density 2 mA/cm$^2$) with the lithium symmetric cells manufactured in Examples 1 to 6 and Comparative Examples 1 to 3, and the results are shown in FIG. 4. As a result, it was identified that Examples 1 to 6 provided with the carbon-based thin film had a significantly decreased overvoltage compared to Comparative Example 1 with no carbon-based thin film formation. In addition, Examples 1 to 6 having a carbon-based thin film thickness of 50 nm to 330 nm also had a decreased overvoltage compared to Comparative Example 2 having a carbon-based thin film thickness of less than 50 nm and Comparative Example 3 having a carbon-based thin film thickness of greater than 330 nm.

Experimental Example 3: Identification of Dendrite Morphology after Electrochemical Charge and Discharge After the charge/discharge of Experimental Example 2, the lithium symmetric cells of Comparative Examples 1 to 3 and Example 3 were dissembled and SEM measured to identify dendrite morphology on the negative electrode surface, and the results are shown in FIGS. 5 to 8. As a result, it was identified that, as identified in FIG. 5, the dendrite of Example 3 had uniform current density distribution, and the form of deposition obtained through lithium reduction was porous and broad.

Meanwhile, it was identified that, as identified in FIGS. 6 to 8, respectively, current density distribution was not uniform in Comparative Examples 1 to 3, and the form of deposition obtained through lithium reduction was nonuniform and vertical as the current shifted to one side.

REFERENCE NUMERAL

100. Positive Electrode
200. Negative Electrode
210. Lithium Metal Layer
220. Carbon-Based Thin Film
300. Separator

The invention claimed is:

1. A negative electrode for a lithium secondary battery comprising:
    a lithium metal layer;
    a carbon-based thin film deposited on at least one surface of the lithium metal layer and having a thickness of 165 nm to 330 nm; and
    an organosulfur protective layer on one surface of the carbon-based thin film not adjoining the lithium metal layer,
    wherein the lithium metal layer has a thickness of 1 μm to 500 μm.

2. The negative electrode for a lithium secondary battery of claim 1, wherein the lithium metal layer further includes a current collector on one surface not adjoining the carbon-based thin film.

3. The negative electrode for a lithium secondary battery of claim 1, wherein the carbon-based thin film is formed with amorphous carbon.

4. The negative electrode for a lithium secondary battery of claim 1, wherein the organosulfur protective layer includes an organosulfur compound, and the organosulfur compound includes a thiol group-containing monomer or polymer.

5. The negative electrode for a lithium secondary battery of claim 4, wherein the organosulfur protective layer includes one or more types of compounds selected from the group consisting of 2,5-dimercapto-1,3,4-thiadiazole, bis(2-mercapto-ethyl)ether, N,N'-dimethyl-N,N'-dimercaptoethylene-diamine, N,N,N',N'-tetramercapto-ethylenediamine, 2,4,6-trimercaptotriazole, N,N'-dimercapto-piperazine, 2,4-dimercaptopyrimidine, 1,2-ethanedithiol and bis(2-mercapto-ethyl)sulfide.

6. The negative electrode for a lithium secondary battery of claim 1, wherein the organosulfur protective layer includes an electron conducting polymer.

7. The negative electrode for a lithium secondary battery of claim 6, wherein the electron conducting polymer includes one or more types of compounds selected from the group consisting of polyaniline, poly(p-phenylene), polythiophene, poly(3-alkylthiophene), poly(3-alkoxythiophene), poly(crown ether thiophene), polypyrrole, poly(dialkyl-2,2'-bipyridine), polypyridine, polyalkylpyridine, poly(2,2'-bipyridine), poly(dialkyl-2,2'-bipyridine), polypyrimidine, polydihydrophenanthrene, polyquinoline, polyisoquinoline, poly(1,2,3-benzothiadiazole), poly(benzimidazole), poly(quinoxaline), poly(2,3-diarylquinoxaline), poly(1,5-naphthyridine), poly(1,3-cyclohexadiene), poly(anthraquinone), poly(Z-methylanthraquinone), poly(ferrocene) and poly(6,6'-biquinoline).

8. A lithium secondary battery comprising:
    a positive electrode;
    a negative electrode; and
    an electrolyte,
    wherein the negative electrode is the negative electrode of claim 1.

9. The negative electrode for a lithium secondary battery of claim 1, wherein an organosulfur compound is present in the organosulfur protective layer in an amount of 50% by weight to 100% by weight with respect to a total weight of the organosulfur protective layer.

10. The negative electrode for a lithium secondary battery of claim 3, wherein the amorphous carbon comprises at least one of hard carbon, corks, mesocarbon microbead (MCMB) baked at 1500° C. or lower, or mesophase pitch-based carbon fiber (MPCF).

* * * * *